Figure 1:
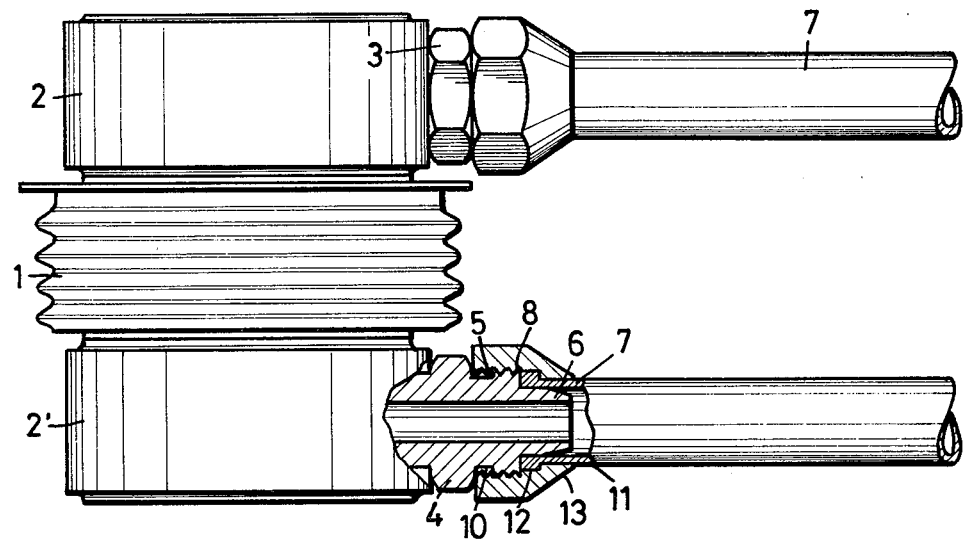

United States Patent [19]

Klein

[11] 4,142,577

[45] Mar. 6, 1979

[54] COOLING DEVICE FOR A LIQUID-COOLED SEMICONDUCTOR POWER COMPONENT

[76] Inventor: Erwin Klein, Dresdnerstr. 5, Heddesheim, Fed. Rep. of Germany, 6805

[21] Appl. No.: 776,228

[22] Filed: Mar. 10, 1977

[51] Int. Cl.$^2$ .......................... F28F 9/26; H01L 25/04
[52] U.S. Cl. .................................. 165/80; 174/15 R; 285/382.4; 285/386; 357/82
[58] Field of Search ............. 165/80, 178; 174/15 BH, 174/15 R; 357/82; 361/381, 385; 285/354, 386, 382, 382.4

[56] References Cited

U.S. PATENT DOCUMENTS

| | | | |
|---|---|---|---|
| 2,179,293 | 11/1939 | Hein | 357/82 |
| 2,189,566 | 2/1940 | Kreidel | 285/382 |
| 2,445,702 | 7/1948 | Weyenberg et al. | 285/382.4 |
| 3,831,983 | 8/1974 | Stickler | 285/386 |
| 4,020,399 | 4/1977 | Suzuki et al. | 174/15 R |
| 4,051,509 | 9/1977 | Beriger et al. | 357/82 |

*Primary Examiner*—Charles J. Myhre
*Assistant Examiner*—Sheldon Richter
*Attorney, Agent, or Firm*—Herbert L. Lerner

[57] ABSTRACT

Cooling device for a liquid-cooled semiconductor power component of the type having a disc cell formed with two main contact surfaces and electrical and thermal pressure-contacting means therefor in an insulating casing, and having means for liquid cooling including cooling capsules through which liquid flows, the cooling capsules being connected by a clamping device to the two main contact surfaces of the disc cell and being selectively couplable through a liquid-conducting support bar to a plurality of semiconductor power components, including insulating screw connections for connecting union pipes and connecting pipes for the coolant to the cooling capsules with an inclusion of at least partly cold-deformable material of the insulating screw connections, the cooling capsules being connected coolant-wise in series, and including expansion bends formed at least in the connecting pipes between the cooling capsules.

1 Claim, 2 Drawing Figures

U.S. Patent  Mar. 6, 1979  4,142,577

COOLING DEVICE FOR A LIQUID-COOLED SEMICONDUCTOR POWER COMPONENT

The invention relates to a cooling device for a liquid-cooled semiconductor power component of the type having a disc cell formed with two main contact surfaces and electrical and thermal pressure contacting means therefor in an insulating casing, and having means for liquid cooling including cooling capsules through which liquid flows, the cooling capsules being connected by a clamping device to the two main contact surfaces of the disc cell and being selectively couplable through a liquid-conducting support bar. Such semiconductor power components find preferential, but not, however, exclusive application in electric locomotives.

In the context herein, "disc-type cell construction" or "disc cell" is to be understood to mean a semiconductor disc which has been previously enclosed in an insulating casing with the interposition of abductor plates. Such semiconductor power components are generally known, for example, Type CS 500 of Brown, Boveri & Cie., Mannheim, Germany, or from "VDI-Zeitschrift" 107 (1965), No. 34, December, p. 1656). It is furthermore known from the last-mentioned literature reference to clamp the disc cell between mushroom-shaped cooling bodies or heat sinks and to provide them, depending upon the desired current-carrying capacity, with natural-draft air cooling, forced-air cooling or with liquid cooling. it has also become known heretofore to provide such disc cells with a central gate (German Published Non-Prosecuted Application DT-OS 2 246 423).

The cooling of thyristors has furthermore been described in "Silizium-Stromrichter-Handbuch" (Silicon Converter Handbook) of BBC Aktiengesellschaft Brown Boveri & Cie., Baden, Switzerland, 1971. The heat accruing due to dissipation can be passed into the environment by means of closed heat pipe coolers, but can also be discharged into the environment through an intermediate cooling loop. In the latter case, the heat is transported from the heat sinks by means of a cooling liquid to a heat exchanger whence it is given off to the air or also to fresh water. Such devices can be built with less weight and volume (an everpresent requirement these days) than directly air-cooled devices because considerably higher heat transfer coefficients are available.

The same applies also to capsule liquid cooling. The subject matter of my co-pending application Ser. No. 776,227, filed Mar. 10, 1977, now abandoned filed simultaneously with this application, has in view high reverse-voltage strength of the semiconductor power component also in equipment highly prone to contamination, and the disc cell is placed for this purpose in a separate housing, interposed with heat sinks (cooling capsules) through which liquid flows. The cooling capsules of several semiconductor power components may be connected to a common, liquid-conducting support bar.

Regardless of whether a closed arrangement according to my afore-mentioned co-pending application or an open arrangement of disc cells and cooling capsules is involved herein, hydraulic lines are required to feed the coolant to and discharge it from a housing connection or the capsule. These lines must be insulated because the cooling capsules are at an electric potential and, therefore, a galvanic separation to the re-cooling devices must be performed. Connecting several capsules of different potentials hydraulically in series may also be sensible. The connections must also be flexible so that they can follow the thermal variations in length of the semiconductor components, and manufacturing tolerances must also be compensated for in the course of assembly.

For this purpose, both of the following connecting techniques are generally known:

(1) The application of flexible insulating tubing, the lengths of which depend upon the difference in electric voltage and the type of coolant. The connection thereof to the cooling capsule is effected through hose nozzles or spouts, and they are secured by means of hose clamps. The reliability thereof against leakage depends upon several factors and decreases, of course, with the number of coupling or connecting operations.

(2) Pipe screw connections are used instead of the hose nozzles. The flexibility of the line is effected through metallic bellows and the insulation through hollow insulators. These parts are then joined together by soldering which can also be conventionally effected in the case of insulators, by means of a preceding metallization operation.

A conceivable type of connection could also be effected by the use of so-called hydraulic hose. This could be insulating hose, onto which screw fittings are pressed.

Inherent in the first technique is a given uncertainty regarding tightness or sealability, which can have an adverse effect, particularly if one is working with insulating liquids in a contaminated atmosphere, because escaped liquid bonds dirt to the insulating paths of the semiconductors and can make the latter inoperative. Similarly, the second technique is characterized by considerable expenses, and the reliability of which further depends also on the quality of a large number of soldered joints. The additionally mentioned technique has the disadvantage that it is of very voluminous construction, because, on the one hand, thick-walled hose must be used so that the connecting fittings can be pressed on and, on the other hand, the latter require considerable length. The installation space required is not available in many cases, however, and the lengths of flow resulting therefrom also cause undesirable pressure drops.

It is accordingly an object of the invention to provide for the cooling device mentioned at the introduction hereto, an hydraulic connecting or joining technique which permits coupling, on the one hand, insulatingly and, on the other hand, by means of screw connections.

With the foregoing and other objects in view, there is provided, in accordance with the invention, a cooling device for a liquid-cooled semiconductor power component of the type having a disc cell formed with two main contact surfaces and electrical and thermal pressure-contacting means therefor in an insulating casing, and having means for liquid cooling including cooling capsules through which liquid flows, the cooling capsules being connected by a clamping device to the two main contact surfaces of the disc cell and being selectively couplable through a liquid-conducting support bar to a plurality of semiconductor power components, comprising insulating screw connections for connecting pipes for the coolant to the cooling capsules with an inclusion of at least partly cold-deformable material of the insulating screw connections, the cooling capsules being connected coolant-wise in series, and including expansion bends formed at least in the connecting pipes between the cooling capsules.

The invention utilizes to advantage the joining technique for insulating screw connections, known from other arts. A clamping and sealing bead is formed by cold-flow of the pipe caused by the screw-tightening operation. This measure has the advantage that one can work with relatively thin-walled and soft pipes, and a desired elasticity can thus be realized better than with the also conventional "cutting-ring"-screw connection for metal pipes. This measure is furthermore distinguished by the feature that the seal is formed directly by the pipe material and therefore, no leaks are determinable over many joining or coupling operations. In spite of the thin walls and relative softness, a pipe always exhibits less elasticity than a corresponding hose. The elasticity is necessary, however, to compensate for tolerances in position or location between hydraulically series-connected capsules, and to make possible the free adjustment thereof relative to the semiconductor elements so that proper and trouble-free contact is effected. Thermal variations in length must also be possible. To this end, the pipes are shaped by a preceding hot deformation in such a manner that expansion bends are provided in accordance with the invention, at least in the connecting pipes between the cooling capsules. It is understood that, if required, and depending on the line direction, the union pipe may also have expansion bends.

In connection with the cooling of a thyristor column by means of heat pipes it has become known heretofore from German Published Non-Prosecuted Application DT-OS 2 417 106, to use elastic, flexible pipe sections and insulating sections between the heat sink of the disc cell and the heat pipes. This compensates for thermal expansions or tolerances due to manufacturing techniques. In the device according to the invention, relief of the screw connections and, therewith, long-term tightness is achieved with these advantages.

In accordance with another feature of the invention, the cooling capsules have doubly stepped-down connecting nozzles, one of the steps thereof having a greater diameter than that of the other step and being formed with an external thread, a transition surface formed on the connecting nozzles between the steps thereof, the transition surface being a stop for the pipe connected to the respective connecting nozzle, and the other step forming a support ring for the pipe, and a screw cap matched to the shape of the respective connecting nozzle disposed on the pipe and in tightened condition on the connecting nozzle, holding a cold-deformed portion of the end of the pipe between the other step of the respective connecting nozzle and a corresponding recess formed in the screw cap.

Although the invention is illustrated and described herein as embodied in cooling device for a liquid-cooled semiconductor power component, it is nevertheless not intended to be limited to the details shown, since various modifications and structural changes may be made therein without departing from the spirit of the invention and within the scope and range of equivalents of the claims.

Figure 2:
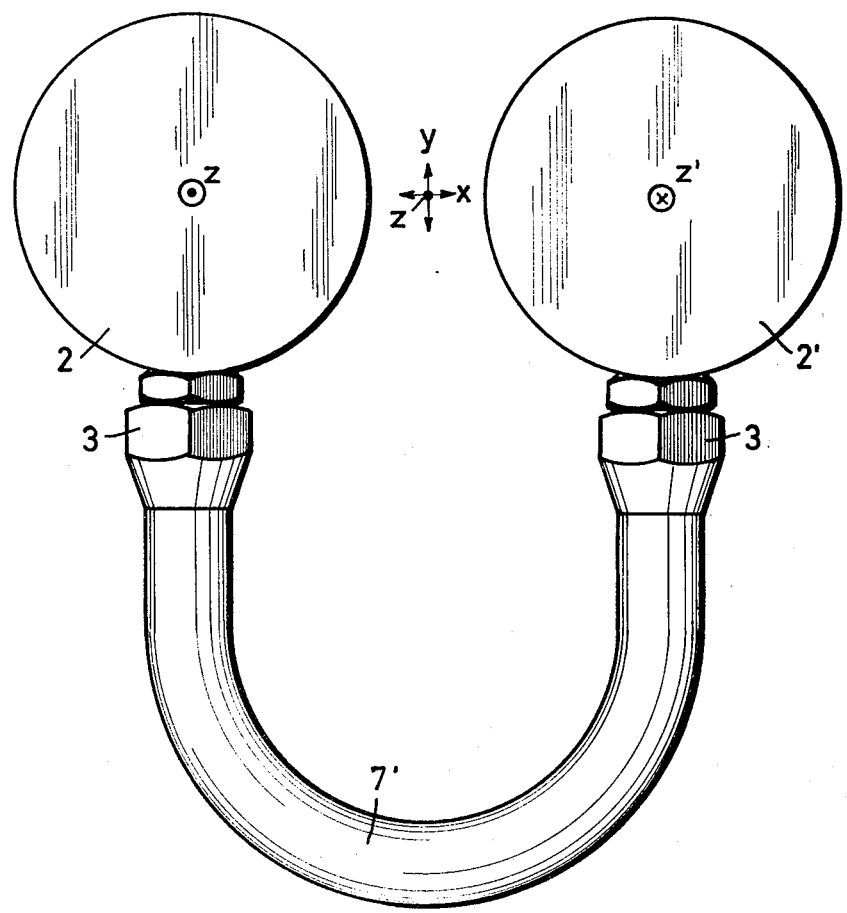

The construction and method of the invention, however, together with additional objects and advantages thereof will be best understood from the following description of specific embodiments when read in connection with the accompanying drawings, in which:

FIG. 1 is an elevational view, partly in section, of a cooling device for a liquid-cooled semiconductor power component according to the invention showing connections to cooling capsules; and FIG. 2 is a plan view of the device of FIG. 1 showing a connection of a pair of cooling capsules.

Referring now to the figures of the drawings and first, particularly to FIG. 1 thereof, there is shown a semiconductor component 1 in disc form clamped between two cooling capsules 2 and 2' by non-illustrated clamping devices. A nozzle or nipple 4 of a screw connection 3 is screwed tightly into the respective cooling capsules 2 and 2'. The nozzle 4 has two shoulders, so that it can carry an external thread 5 and an adjoining, stepped-down support ring 6.

After a connecting pipe 7 has been slid onto the support ring 6 up to the stop 8, which is formed by the step or the transition surface between the thread 5 and the support ring 6, which causes the pipe 7 to become somewhat expanded or widened, a screw cap 9 is applied. The latter, with the internal thread 10 thereof, engages the thread 5 before the pressure ring 11 covers the support ring 6. Further tightening then causes a cold deformation of the pipe 7 in the direction of tightening, there being a flow of material toward the stop 8 and the empty gap or recess 12 of the nut 9. Absolute tightness is achieved thereby, which is always restored even after many loosening or disengagement operations.

Two cooling capsules 2 and 2' are connected by means of an arcuate pipe 7', which, due to preceding hot deformation, constitutes an expansion arc or bend, adequate possibilities for play being provided; these possibilities for play are present if the cooling capsules 2 and 2' are also inclined toward one another, so that proper and trouble-free contact can be achieved. The coolant flows from one connecting pipe 7 through one of the cooling capsules 2 or 2', the connecting pipe 7', the other of the two cooling capsules 2' or 2, and the other connecting pipe 7. The connecting technique is also applicable, however, to connections of one or more semiconductor power components with capsule-liquid cooling to a liquid-carrying support bar of the foregoing type.

There are claimed:

1. Cooling device for a liquid-cooled semiconductor power component of the type having a disc cell formed with two main contact surfaces and electrical and thermal pressure-contacting means therefor in an insulating casing, and having means for liquid cooling including cooling capsules through which liquid flows, the cooling capsules being connected by a clamping device to the two main contact surfaces of the disc cell so as to have the electrical potential thereof and being selectively couplable through a liquid-conducting support bar to a plurality of semiconductor power components, comprising insulating screw connections for connecting union pipes and connecting pipes for the coolant electrically insulatingly to the cooling capsules with an inclusion of at least partly cold-deformable material of said insulating screw connections, the cooling capsules being connected mutually and to a cooling source coolant-wise in series and having doubly stepped-down connecting nozzles, one of the steps thereof having a greater diameter than that of the other step and being formed with an external thread, a transition surface formed on said connecting nozzles between said steps thereof and having a greater diameter than the diameters of both of said steps, respectively, said transition surface being a stop for the pipe connected to the respective connecting nozzle, and said other step forming a support ring for the pipe, and a screw cap matched to the shape of the respective connecting nozzle disposed on the pipe and, in tightened condition on the connecting nozzle, holding a cold-deformed portion of the end of the pipe between the other step of the respective connecting nozzle and a corresponding recess formed in said screw-cap, and including expansion bends formed at least in the connecting pipes between the cooling capsules.

* * * * *